(12) United States Patent
Chang et al.

(10) Patent No.: US 6,323,719 B1
(45) Date of Patent: Nov. 27, 2001

(54) PSEUDO BIPOLAR JUNCTION TRANSISTOR

(75) Inventors: Cheng-Chieh Chang, Taipei Hsien; Shen-Iuan Liu, Taipei, both of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/565,751

(22) Filed: May 8, 2000

(51) Int. Cl.$^7$ ................................................. H03K 17/60
(52) U.S. Cl. ............................ 327/478; 327/543; 327/427
(58) Field of Search ................................... 327/478, 543, 327/389, 390, 391, 403, 404, 405, 427, 431, 432, 434, 435, 437, 473

(56) References Cited

U.S. PATENT DOCUMENTS

| | | | |
|---|---|---|---|
| 5,469,076 | * 11/1995 | Badyal et al. | 326/16 |
| 5,793,239 | * 8/1998 | Kovacs et al. | 327/262 |
| 5,796,281 | * 8/1998 | Saeki et al. | 327/206 |
| 5,801,584 | * 9/1998 | Mori | 327/543 |
| 5,801,586 | * 9/1998 | Ishizuka | 327/545 |
| 5,966,032 | * 10/1999 | Elrabaa et al. | 326/84 |

* cited by examiner

*Primary Examiner*—Timothy P. Callahan
*Assistant Examiner*—Hai L. Nguyen
(74) *Attorney, Agent, or Firm*—Jiawei Huang; J.C. Patents

(57) ABSTRACT

A pseudo bipolar junction transistor according to the invention includes two MOS transistors operating in saturation region, electrically connected in parallel with their drains and sources functioning as a collector and a emitter of the pseudo bipolar junction transistor, respectively, a first gate without any signal inputted and a second gate functioning as a base of the pseudo bipolar junction transistor, wherein the two gates is supplied with the same DC bias. The pseudo bipolar junction transistor is manufactured by CMOS process for applications in variable gain amplifiers, transfer linear function signal processors and logarithmic filters.

9 Claims, 8 Drawing Sheets

PSEUDO BIPOLAR JUNCTION TRANSISTOR

BACKGROUND OF THE INVENTION

Field of the Invention

The invention relates to a bipolar junction transistor, and more particularly to a pseudo bipolar junction transistor using CMOS process.

2. Description of the Related Art

Variable grain amplifiers, auto-gain controllers, transfer linear function signal processors and recently-developed logarithmic filters and logarithmic current control oscillators are significantly applied in various fields. There is a common point for those circuits that bipolar junction transistors (BJTs) having an exponential function are used. Although in CMOS process, lateral transistors and MOS transistors operating in weak inversion region can be used for replacement, their application fields are limited due to their poor performances. Therefore, in many fields, BJTs can not be replaced with MOS transistors.

For variable gain amplifier and auto-gain controller applications, several pseudo-exponential circuits designed according to CMOS technology has been successfully developed. However, due to their complicated structures, the pseudo-exponential circuits can not function as BJTs. Therefore, CMOS transistors operating in saturation region are used to replace BJTs. The reason how come does the CMOS transistors operate in saturation region is that MOS transistors in weak inverse region has a narrow operation region, poor frequency response and poor match effect. Furthermore, lateral transistors have a small collector-base current gain and a larger leakage current. Consequently, making MOS transistors operate in saturation region has a valuable application.

SUMMARY OF THE INVENTION

In view of the above, the invention provides a pseudo bipolar junction transistor circuit which is performed by CMOS transistors operating in saturation region. The pseudo bipolar junction transistor circuit according to the invention has a simple structure, being able to function as a single bipolar junction transistor. Therefore, variable gain amplifiers, transfer linear function signal processors and logarithmic filters and oscillators can be realized using the inventive pseudo bipolar junction transistor. Moreover, the principle for designing various circuits using the inventive pseudo bipolar junction transistor is the same as that using the general bipolar junction transistor. Therefore, bipolar junction transistors used in original circuits can be directly replaced by the inventive pseudo bipolar junction transistors, with an appropriate bias current selected. Therefore, in intermediate frequency applications and designs, BiCMOS process can be replaced with CMOS process, thereby simplifying the requirements of process.

In order to attain the above-stated objects, a pseudo bipolar junction transistor according to the invention includes two MOS transistors operating in saturation region. The two MOS transistors are electrically connected in parallel with their drains and sources functioning as a collector and a emitter of the pseudo bipolar junction transistor, respectively, a first gate without any signal inputted and a second gate functioning as a base of the pseudo bipolar junction transistor, wherein the two gates are supplied with the same DC bias.

The pseudo bipolar junction transistor further includes two identical squares. The two identical squares are electrically connected to the two MOS transistors in series, having the same bias, one without any signal inputted and the other with a signal inputted. The outputs of the two identical squarers are added to each other to generate a pseudo exponential function, and then the pseudo exponential function is expanded into a Tyler series with the terms over two order omitted.

Furthermore, the pseudo bipolar junction transistor includes a constant current source and a PMOS transistor. One terminal of the constant current source is electrically connected to the source of the PMOS transistor, and the gate of the PMOS transistor is electrically connected to the sources of the MOS transistors to prevent constant DC bias from being affected by variation of the source voltage.

The pseudo bipolar junction transistor further includes a first PMOS transistor, a second PMOS transistor, a third PMOS transistor and a four PMOS transistor. The gates of the first PMOS transistor and the second PMOS transistor are electrically connected to the sources of the MOS transistors, the source of the third PMOS transistor is electrically connected to the drain of the first PMOS transistor and the source of the four PMOS transistor is electrically connected to the drain of the second PMOS transistor.

According to the invention, the pseudo bipolar junction transistor has a characteristic equation similar to that of a general bipolar junction transistor. The pseudo bipolar junction transistor can easily replace the general bipolar junction transistor for applications in variable gain amplifiers, auto-gain controllers, transfer linear function signal processors and recently-developed logarithmic filters and logarithmic current controlled oscillators. The pseudo bipolar junction transistor is manufactured by CMOS process instead of BiCMOS process.

BRIEF DESCRIPTION OF THE DRAWINGS

The invention will become more fully understood from the detailed description given hereinafter and the accompanying drawings which are given by way of illustration only, and thus do not limit the present invention, and wherein.

DETAILED DESCRIPTION OF THE PREFERRED EMBODIMENTS

There is an exponential relation between the base-emitter voltage and collector current of a bipolar junction transistor (BJT). When $|x|<1$, an exponential function can be expanded into a Taylor series with the terms over two orders omitted, by:

$$e^x \cong 1 + \frac{1}{1!}x + \frac{1}{2!}x^2 \qquad (1)$$

Furthermore, Equation (1) can be rewritten as:

$$2b^2 e^{\frac{a}{b}x} \cong b^2 + (b+ax)^2 \qquad (2)$$

Figure 1A:
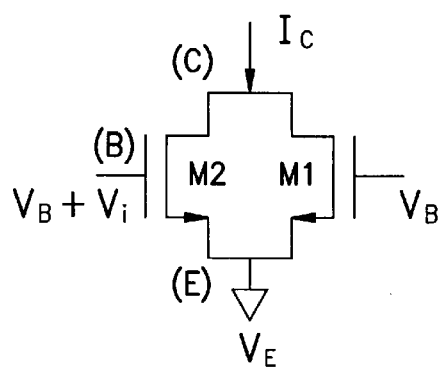
FIGS. 1A, 1B, 1C and 1D are circuit diagrams showing a pseudo bipolar junction transistor according to the invention.

According to Equation (2), a pseudo bipolar junction transistor which includes two NMOS transistors M1, M2 electrically connected in parallel having their sources and drains functioning as a collector and an emitter thereof, respectively, can be expressed in FIG. 1A. In FIG. 1A, the drain currents of the two matched NMOS transistors M1 and M2 operating in saturation region can be expressed by:

$$I_{M1} = K(V_H - V_E - V_{TH})^2 \qquad (3)$$

$$I_{M2} = K(V_i + V_B - V_E - V_{TH})^2 \qquad (4)$$

Then, the collector current $I_C = (I_{M1} + I_{M2})$ can be obtained by:

$$I_c = I_s^{\frac{V_i}{V_T}} \qquad (5)$$

$$I_s = 2K(V_H - V_E - V_{Th})^2$$

$$V_T = V_H - V_E - V_{Th}$$

wherein $V_i$ is an input voltage, $V_{TH}$ is a threshold voltage, $V_H$ is a pseudo base bias voltage, $V_E$ is a pseudo emitter voltage and K is a transfer coefficient. Equation (5) is a characteristic equation of the inventive pseudo bipolar junction transistor. Although it is a pseudo equation, the error of Equation (5) is less than 5% when $$-0.575 \leq \frac{V_i}{V_T} \leq 0.815.$$

Meanwhile the characteristic equation of the pseudo bipolar junction transistor is the same as that of the BJT. Therefore, the inventive pseudo bipolar junction transistor shown in FIG. 1A can be used to replace the BJT.

The pseudo bipolar junction transistor of FIG. 1A has a characteristic equation similar to BJT. It, however, will cause a problem that a dynamic output range is too narrow if the pseudo bipolar junction transistor is applied in variable gain amplifiers and auto-gain controllers. Fortunately, a plurality of squarers (not shown) can be coupled to the pseudo bipolar junction transistor in series, and therefore, a pseudo exponential function $e^{2nx}$ can be obtained, wherein n is the number of the squarers. Since the dynamic output range is 2n times the value $e^x$, for a dynamic range of 80 dB, three squares are needed. Typically, no more than four squarers are needed. Taking two squarers having the same bias voltage as an example, one of two squares is not supplied with an input signal while the other squarer is supplied with an input signal. The two outputs of two squarers are added to each other to obtain a pseudo exponential function, and then the pseudo exponential function is expanded into a Tyler series with the terms over two orders omitted.

The pseudo bipolar junction transistor shown in FIG. 1A can be successfully applied to variable gain amplifiers and auto-gain controllers. However, the pseudo bipolar junction transistor is a grounded device. In other words, the thermal voltage $V_T$ of the general bipolar junction transistor is a constant value under a constant temperature while the thermal voltage $V_T$ ($=V_B-V_E-V_{TH}$) of the pseudo bipolar junction transistor varies with the emitter voltage, and therefore, the pseudo bipolar junction transistor can not function as a floating device in transfer linear function signal processors and logarithmic filters.

Figure 1B:
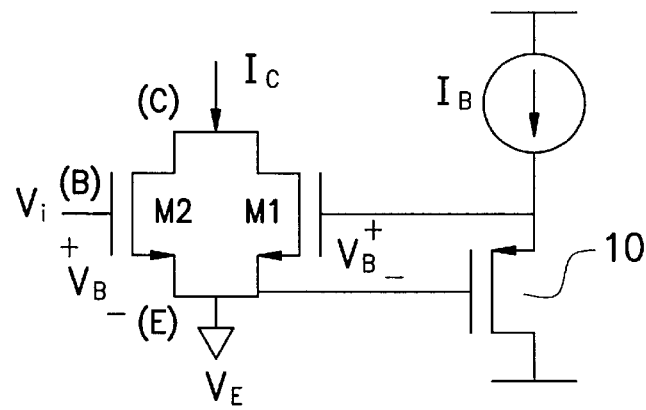
Figure 1C:
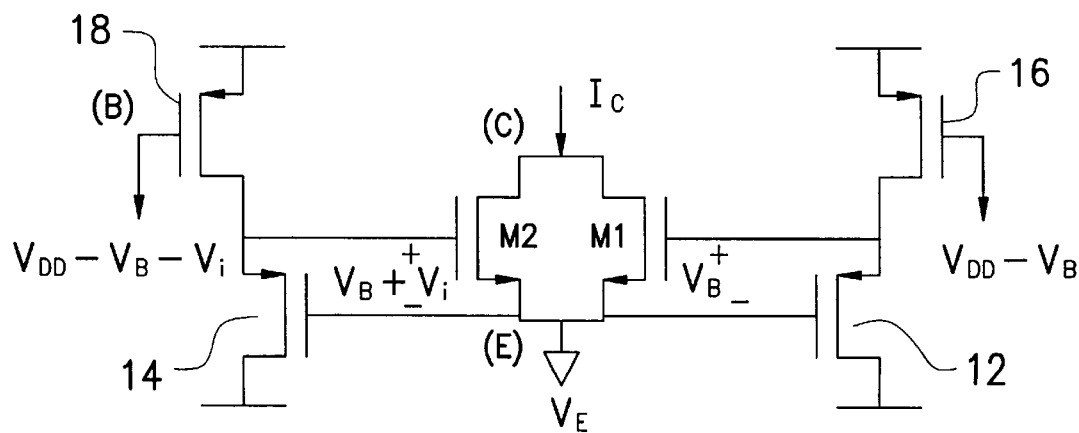

To resolve the above-stated problem, the invention provides an improved pseudo bipolar junction transistor as shown in FIG. 1B. In FIG. 1B, the improved pseudo bipolar junction transistor includes two NMOS transistors M1, M2, a constant current source $I^B$ and a PMOS transistor 10. The output terminal of the constant current source $I_B$ is electrically coupled to the gate of the NMOS transistor M1 and the source of the PMOS transistor 10. The gate of the PMOS transistor 10 is electrically connected to the sources of the NMOS transistors M1, M2, wherein $V_T = V_B - V_{TH}$. Since $V_T$ is not affected by the emitter voltage, and $V_B$ can be controlled by a bias current $I_B$, $V_T$ is a constant value. Consequently, the improved pseudo bipolar junction transistor of FIG. 1B can function as a floating device in transfer linear function signal processors and logarithmic filters. Furthermore, the improved pseudo bipolar junction transistor of FIG. 1B is a current input device which must have an input current Ic ($0.5631 I_S \leq I_C \leq 2.259 I_S$) to make the pseudo bipolar junction transistor have a proper bias voltage $V_B$. That is, the NMOS transistors M1, M2 must be supplied with a proper bias voltage $V_B$. To overcome this problem, the invention provides another improved pseudo bipolar junction transistor as shown in FIG. 1C. In FIG. 1C, the improved pseudo bipolar junction transistor includes two NMOS transistors M1, M2, a first PMOS transistor 12, a second PMOS transistor 14, a third PMOS transistor 16 and a four PMOS transistor 18. The gates of the first PMOS transistor 12 and the second PMOS transistor 14 are electrically coupled to the sources of the NMOS transistors M1, M2. The source of the third PMOS transistor 16 is electrically coupled to the gate of the NMOS transistor MI and the drain of the first PMOS transistor 12. The source of the four PMOS transistor 18 is electrically connected to the gate of the NMOS transistor M2 and the drain of the second PMOS transistor 14. For applications in signal processors and logarithmic filters, it is enough to adopt the pseudo bipolar function transistor of FIG. 1B.

Figure 1D:
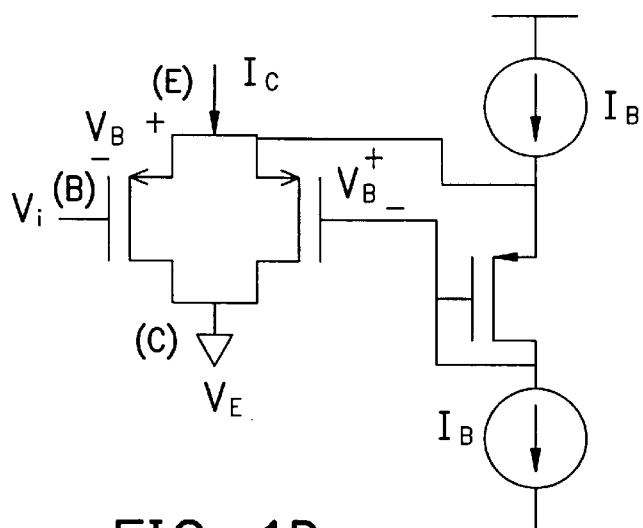

The floating pseudo bipolar junction transistors of FIGS. 1B and 1C face a problem of body effect in N-Well process, causing variation of the threshold voltage $V_{TH}$, and then affecting the value of $V_T$. That is, $V_T$ is no longer a constant value. In this case, these pseudo bipolar junction transistors of FIGS. 1B and 1C can not function as a floating device. There are two ways to avoid body effect, for example, in N-Well process. First, PMOS transistors are used instead of NMOS transistors because the body voltage of PMOS transistors is controllable in N-Well process, and the bias circuit is properly modified as shown in FIG. 1D. Additionally, any circuit structure which is not sensible to body effect can be adopted, for example, a differential circuit having a symmetric structure that can counteract body effect.

Moreover, the dynamic range of the grounded pseudo bipolar junction transistor according to the invention can be improved by serially connecting squarers. However, it is not suitable for the floating pseudo bipolar junction transistor to add squarers to increase the dynamic range because it will increase complexity on circuit designs. For intermediate frequency applications in transfer liner function signal processors and logarithmic filters, a larger bias current and aspect ratio of transistors (W/L) can be used to attain requirements of the static output range.

Next, there are several experimental results using 0.8 $\mu$m CMOS process will be described as follows:

Experiment 1: Exponential Voltage-Current Converter

Figure 2A:
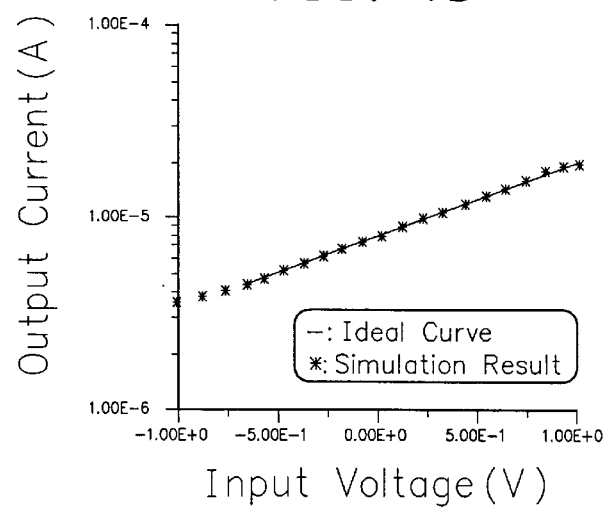
FIG. 2A is a graph showing a relationship of input voltage-output current of the pseudo bipolar junction transistor of FIG. 1A.

Referring to FIG. 2A, a relationship between the input voltage and the output current of the pseudo bipolar junction transistor of FIG. 1A is shown, wherein power source is ±1.5, $V_E$=−1.5V, $V_{TH}$=0.755, $V_B$=0.25V, W=5 $\mu$m and L=50 $\mu$m. The result shows that the dynamic range of the output current is approximately 12dB and error is less than 2% when the input voltage is between −0.65V and 0.9V.

Figure 2B:
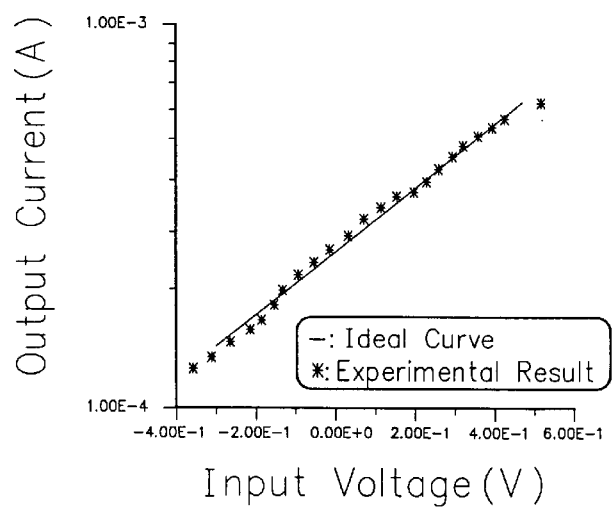
FIG. 2B is a graph showing a relationship of input voltage-output current of the pseudo bipolar junction transistor of FIG. 1A, using detached transistor devices (CD4007)

Referring to FIG. 2B, a relationship between the input voltage and the output current of the pseudo bipolar junction transistor of FIG. 1A using detached transistor devices (CD4007). The power source is ±1.5, $V_E$=−1.5V and $V_B$=0.5V. The result shows that the dynamic range of the output current is approximately 12dB, error is less than 5%, when the input voltage ranges from −0.32V to 0.48V Experiment 2: Four Quadrant Transfer Linear Function Divider Referring to FIG. 3, a four quadrant transfer linear function divider is shown. The characteristic equation of the four quadrant transfer linear function divider can be expressed by:

$$i_O = \frac{i_1 - i_2}{I_1}$$

Figure 3:
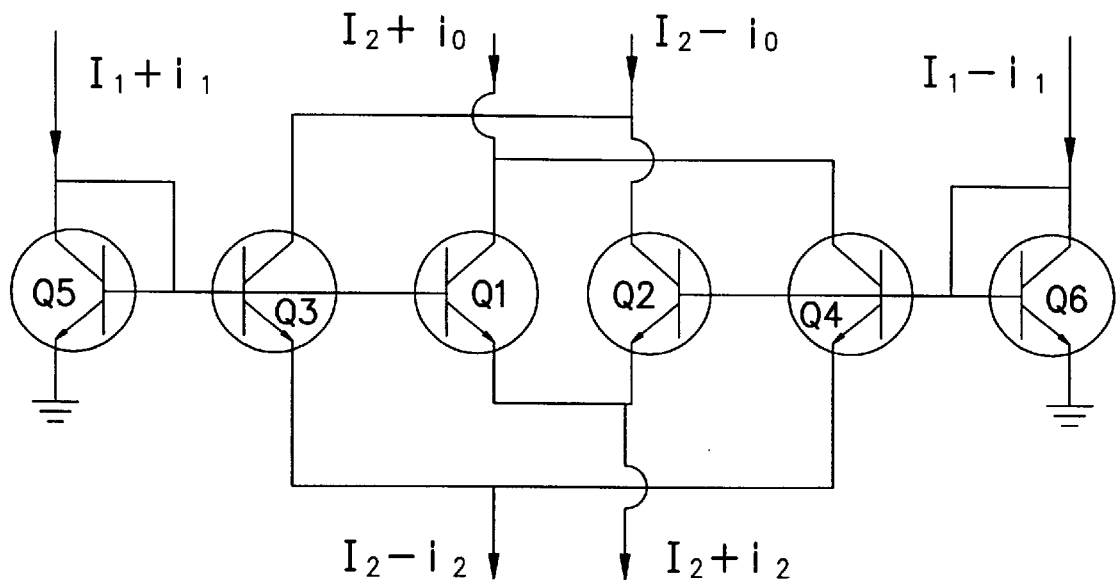
FIG. 3 is a circuit diagram showing a four-quadrant divider having a transfer linear function.
Figure 4:
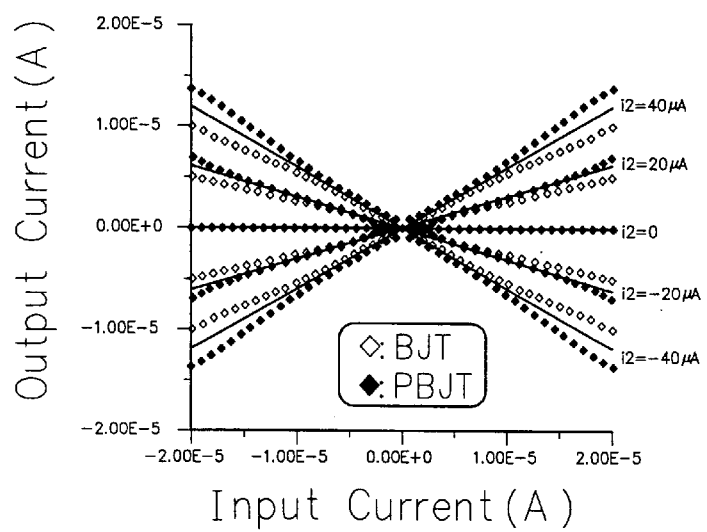
FIG. 4 is a graph showing a relationship of input current-output current of the four-quadrant divider of FIG. 3.

FIG. 4 shows a relationship between the input current and the output current of the four quadrant transfer linear function divider of FIG. 3. In FIG. 4, the bipolar junction transistor is compared to the pseudo bipolar junction transistor, wherein the bipolar junction transistor's β=10, the aspect ratio (W/L) of the pseudo bipolar junction transistor=5 $\mu$m/5 $\mu$m, $V_B$=1.75V, power source=3V, $I_1$=70 $\mu$A and $I_2$=140 $\mu$A. The result shows that error of the divider using the bipolar junction transistor is approximately 14% while error of the divider using the pseudo bipolar junction transistor is less than 6.5% when −15 $\mu$A≦$i_1$≦15 $\mu$A and −40 $\mu$A≦$i_2$≦40 $\mu$A. The error of the divider using the bipolar junction transistor is larger because of the bipolar junction transistor is finite.

Experiment 3: First Order Logarithmic Low Pass Filter

Figure 5:
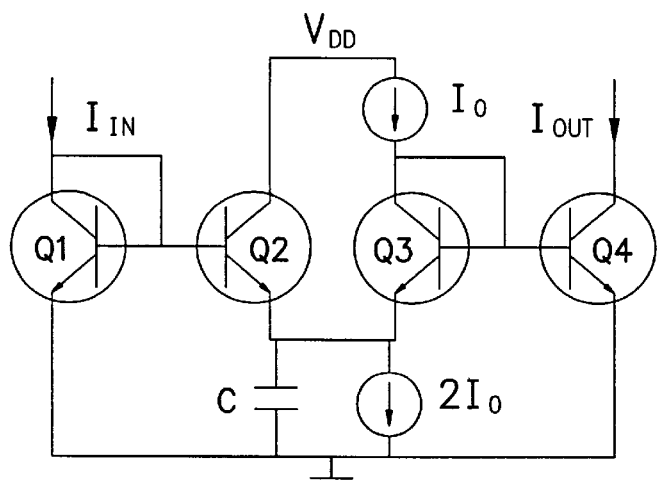
FIG. 5 is a circuit diagram showing a simple first order logarithmic low pass filter.

Referring to FIG. 5, a simple first order logarithmic low pass filter is shown, wherein the transfer function thereof is as follows:

$$\frac{I_{out}}{I_{IN}} = \frac{1}{1 + s\tau}$$

wherein $$\tau = \frac{CV_T}{I_O}, -3\text{dB} = \frac{I_O}{2\pi CV_T}.$$

Figure 6A:
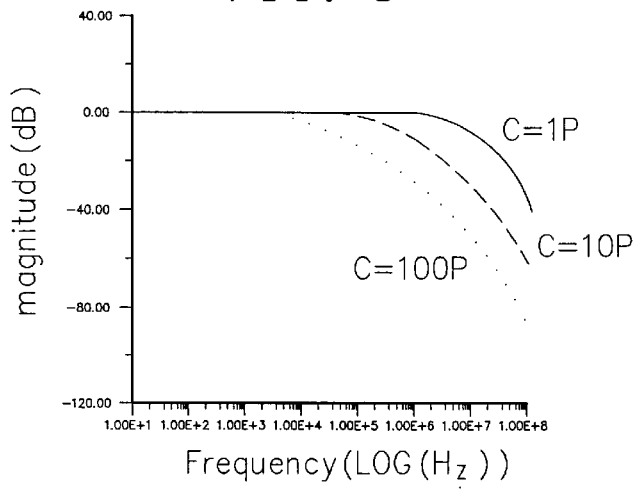
FIG. 6A is a graph showing a frequency response of the filters of FIG. 5.
Figure 6B:
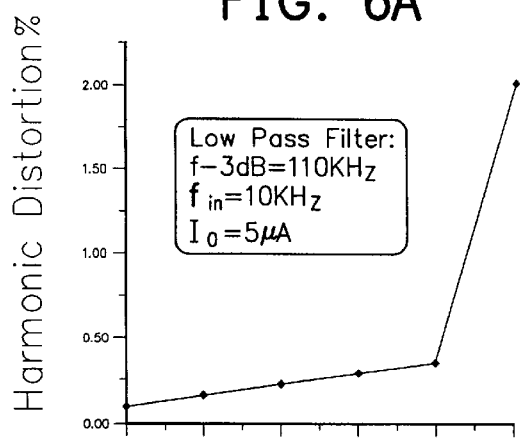
FIG. 6B is a graph showing a harmonic distortion of the low pass filter of FIG. 5.

FIG. 6A shows a frequency response of the low pass filter of FIG. 5, wherein power source=3V, $I_O$=5 $\mu$A, $V_B$=1.5V, the aspect ratio (W/L) of the pseudo bipolar junction transistor= $\mu$m/5 $\mu$m, and capacitance=1 pF, 10 pF and 100 pF. FIG. 6B shows a relationship between the modulation index and the harmonic distortion of the low pass filter of FIG. 5, wherein the input signal $I_{IN}$ is less than 50% of the bias voltage current $I_O$, and the sum of the harmonic distortion is less than 0.22%. From FIG. 6A, the frequency response is inversely proportional to the capacitance.

Experiment 4: First Order High Pass Filter

Figure 7:
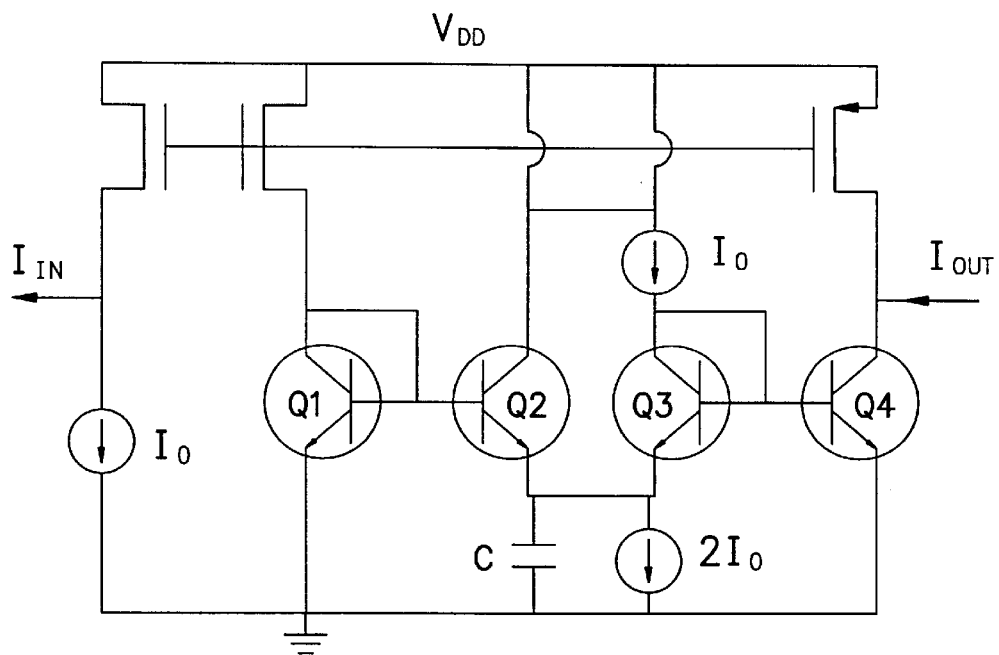
FIG. 7 is a circuit diagram showing an improved first order logarithmic high pass filter.

FIG. 7 is an improved first order high pass filter, wherein the transfer function thereof is as follows:

$$\frac{I_{out}}{I_{IN}} = \frac{-s\tau}{1 + s\tau}$$

Figure 8:
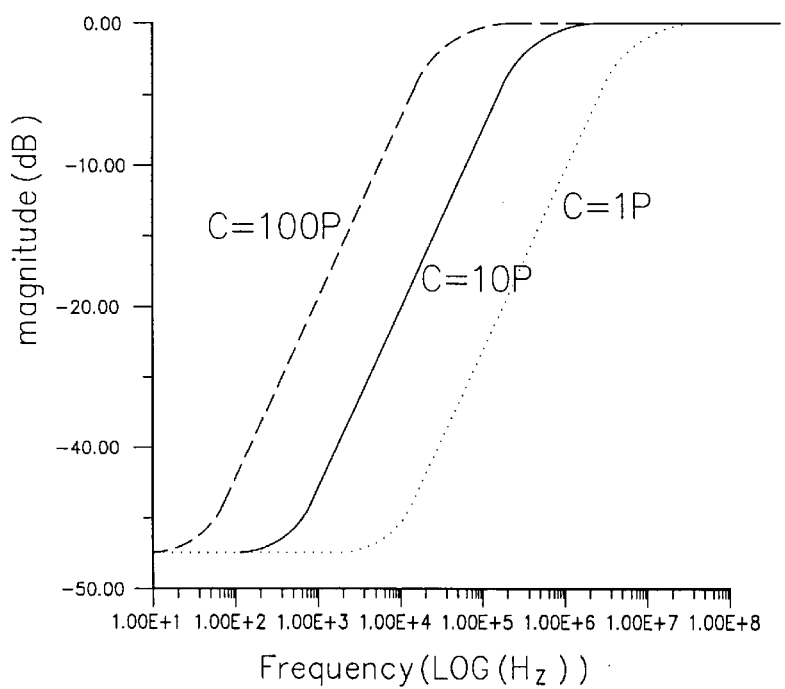
FIG. 8 is a graph showing a frequency response of the high pass filter of FIG. 7.

Moreover, the parameters of the high pass filter are the same as those of the low pass filter. FIG. 8 shows a frequency response of the high pass filter of FIG. 7. The result shows that the frequency response is inversely proportional to the capacitance.

Experiment 5: Logarithmic Band Pass Filter

Figure 9A:
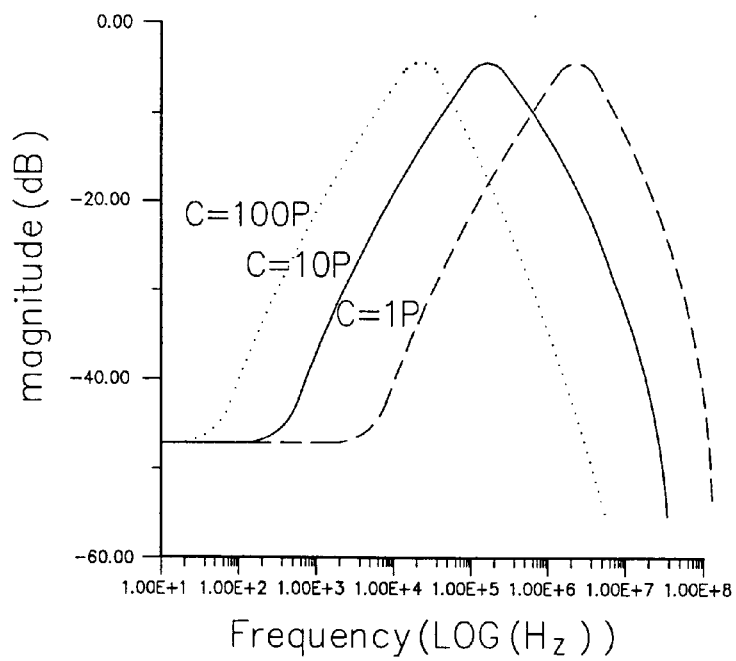
FIGS. 9A and 9B are graphs showing a frequency response of a band pass filter.
Figure 9B:
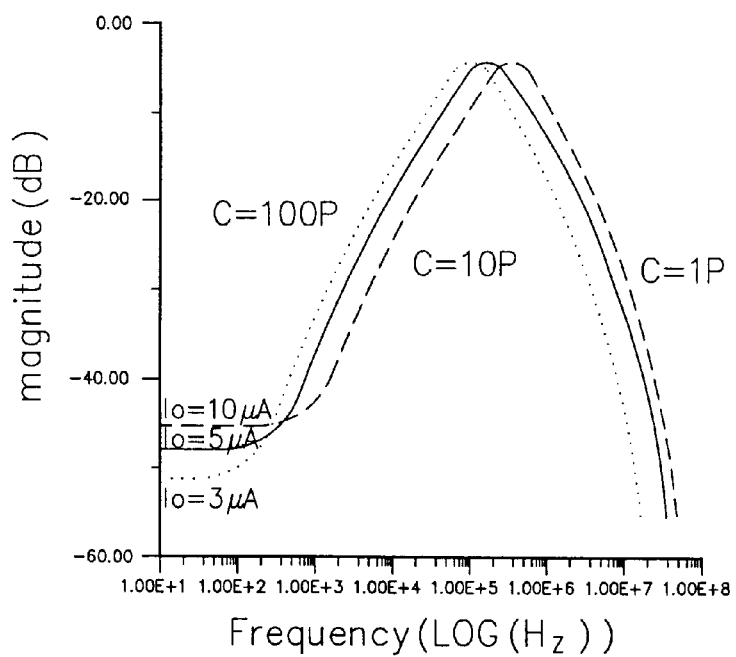

The low pass filter of FIG. 5 is electrically connected to the high pass filter of FIG. 7 in series to form a logarithmic band pass filter. FIGS. 9A and 9B shows the frequency response of the band pass filter, wherein the frequency response is inversely proportional to the capacitance and positively proportional to the bias current $I_O$.

Experiment 6: Logarithmic Current Controlled Oscillator

Figure 10:
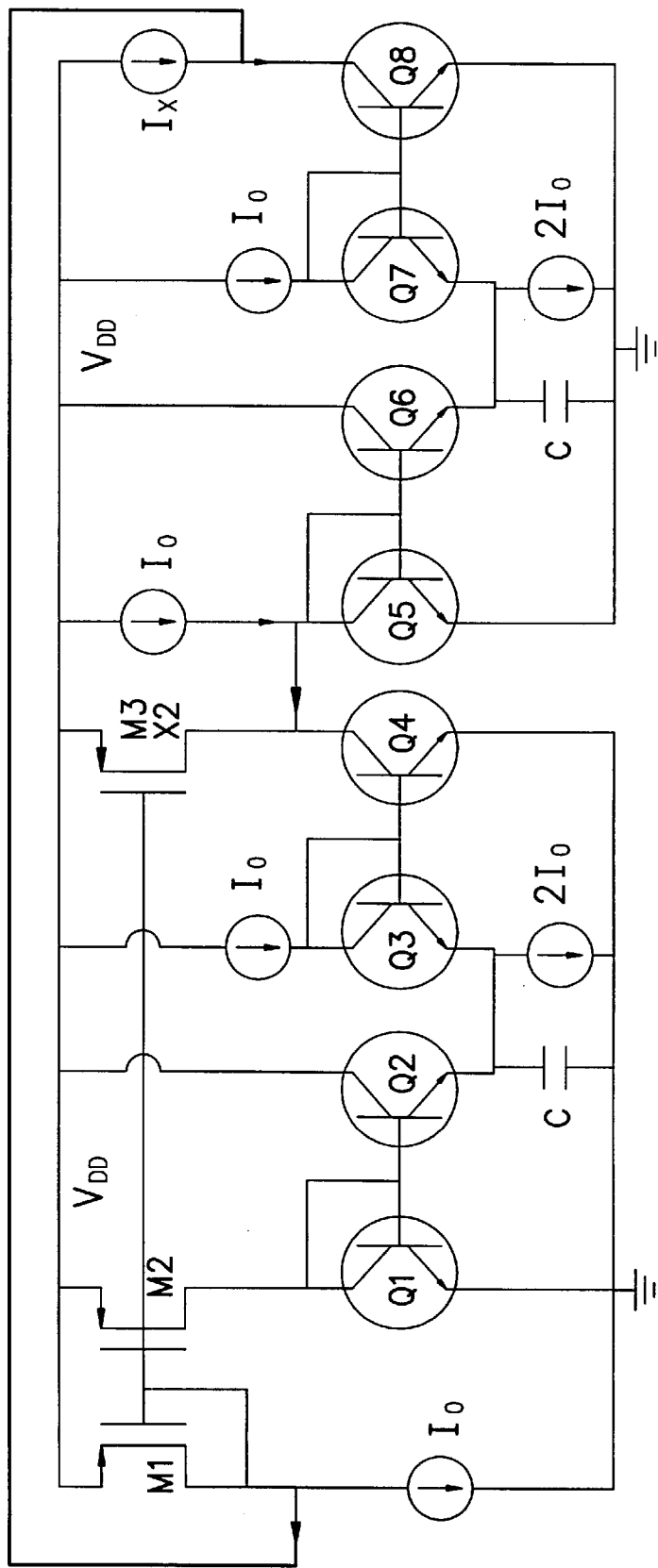
FIG. 10 is a circuit diagram showing a current control oscillator formed by connecting the input of a band pass filter to the output thereof and properly adjusting the gain of the band pass filter.
Figure 11A:
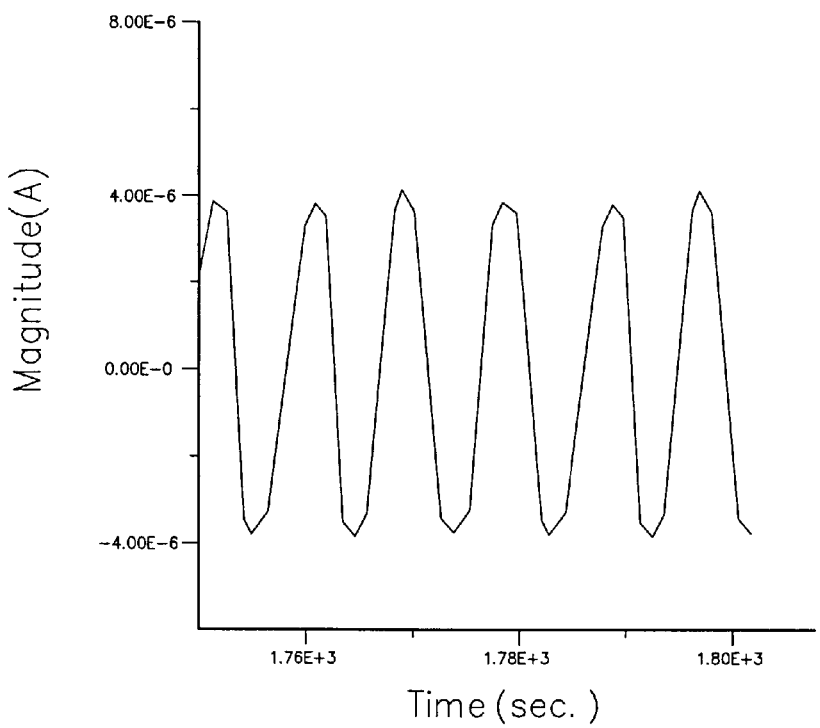
FIG. 11A is a graph showing a transition response of the oscillator of FIG. 10.
Figure 11B:
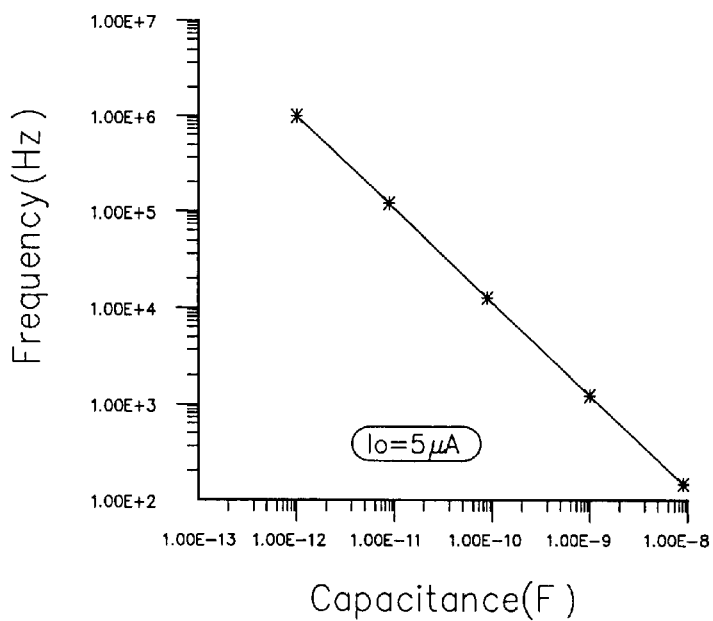
FIG. 11B is a graph showing a relationship between the oscillation frequency and capacitance of the oscillator of FIG. 10.

Referring to FIG. 10, a current controlled oscillator is formed by adjusting the gain of the band pass filter and connecting the input to the output thereof. FIG. 11A shows a transition response of the oscillator. FIG. 11B shows a relationship between the oscillation frequency and capacitance of the oscillator. The result shows that the oscillation frequency is inversely proportional to the capacitance as calculated.

In summary, a pseudo bipolar junction transistor according to the invention has a characteristic equation similar to that of a general bipolar junction transistor. The pseudo bipolar junction transistor can easily replace the general bipolar junction transistor for applications in variable gain amplifiers, auto-gain controllers, transfer linear function signal processors and recently-developed logarithmic filters and logarithmic current controlled oscillators. The pseudo bipolar junction transistor is manufactured by CMOS process instead of BiCMOS process.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. The pseudo bipolar junction transistor comprising:

two MOS transistors operating in saturation region, electrically connected in parallel with their drains and sources functioning as a collector and a emitter of the pseudo bipolar junction transistor, respectively, a first gate without any signal inputted and a second gate functioning as a base of the pseudo bipolar junction transistor, wherein the two gates are supplied with the same DC bias;

two identical squarers electrically connected to the two MOS transistors in series, having the same bias, one without any signal inputted and the other with a signal inputted, wherein the outputs of the two identical squarers are added to each other to generate a pseudo exponential function, and then the pseudo exponential function is expanded into a Tyler series with the terms over two order omitted.

2. The pseudo bipolar junction transistor as claimed in claim 1, wherein the MOS transistors are NMOS transistors.

3. The pseudo bipolar junction transistor as claimed in claim 1, wherein the MOS transistors are PMOS transistors.

4. The pseudo bipolar junction transistor comprising:

two MOS transistors operating in saturation region, electrically connected in parallel with their drains and sources functioning as a collector and a emitter of the pseudo bipolar junction transistor, respectively, a first gate without any signal inputted and a second gate functioning as a base of the pseudo bipolar junction transistor, wherein the two gates are supplied with the same DC bias;

a first PMOS transistor, a second PMOS transistor, a third PMOS transistor and a four PMOS transistor, wherein the gates of the first PMOS transistor and the second PMOS transistor are electrically connected to the sources of the MOS transistors, the source of the third PMOS transistor is electrically connected to the drain of the first PMOS transistor and the source of the four PMOS transistor is electrically connected to the drain of the second PMOS transistor.

5. The pseudo bipolar junction transistor as claimed in claim 4, wherein the MOS transistors are NMOS transistors.

6. The pseudo bipolar junction transistor as claimed in claim 4, wherein the MOS transistors are PMOS transistors.

7. The pseudo bipolar junction transistor comprising:

two MOS transistors operating in saturation region, electrically connected in parallel with their drains and sources functioning as a collector and a emitter of the pseudo bipolar junction transistor, respectively, a first gate without any signal inputted and a second gate functioning as a base of the pseudo bipolar junction transistor, wherein the two gates are supplied with the same DC bias;

a constant current source and a PMOS transistor, wherein one terminal of the constant current source is electrically connected to the source of the PMOS transistor, and the gate of the PMOS transistor is electrically connected to the sources of the MOS transistors to prevent constant DC bias from being affected by variation of the source voltage.

8. The pseudo bipolar junction transistor as claimed in claim 7, wherein the MOS transistors are PMOS transistors.

9. The pseudo bipolar junction transistor as claimed in claim 7, wherein the MOS transistors are NMOS transistors.

* * * * *